(12) United States Patent
White et al.

(10) Patent No.: US 7,160,769 B2
(45) Date of Patent: Jan. 9, 2007

(54) CHANNEL ORIENTATION TO ENHANCE TRANSISTOR PERFORMANCE

(75) Inventors: Ted R. White, Austin, TX (US);
Alexander L. Barr, Crolles (FR);
Dejan Jovanovic, Austin, TX (US);
Bich-Yen Nguyen, Austin, TX (US);
Mariam G. Sadaka, Austin, TX (US);
Voon-Yew Thean, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 242 days.

(21) Appl. No.: 10/969,108

(22) Filed: Oct. 20, 2004

(65) Prior Publication Data

US 2006/0084207 A1   Apr. 20, 2006

(51) Int. Cl.
*H01L 21/336* (2006.01)
*H01L 29/78* (2006.01)

(52) U.S. Cl. ............... 438/198; 438/199; 438/275; 257/369; 257/E21.409; 257/E29.255

(58) Field of Classification Search ............ 438/198, 438/199, 257; 257/369, E21.409, E29.255
See application file for complete search history.

(56) References Cited

U.S. PATENT DOCUMENTS

| 5,729,045 | A * | 3/1998 | Buynoski | 257/627 |
| 6,921,948 | B1 * | 7/2005 | Watt | 257/369 |
| 2004/0150013 | A1 * | 8/2004 | Ipposhi | 257/288 |
| 2004/0161886 | A1 * | 8/2004 | Forbes et al. | 438/198 |

FOREIGN PATENT DOCUMENTS

WO   WO 02/045156 A3   6/2002

OTHER PUBLICATIONS

Yang et al., "High Performance CMOS Fabricated on Hybrid Substrate With Different Crystal Orientations," IEEE, 2003, 4 pgs.
Matsumoto et al., "Novel SOI Wafer Engineering Using Low Stress and High Mobility CMOSFET with <100>-Channel for Embedded RF/Analog Applications," IEEE, 2002, pp. 663-666.
Aoki et al., "Optimum Crystallographic Orientation of Submicrometer CMOS Devices Operated at Low Temperatures," IEEE Transactions on Electron Devices, vol. RD-34K. No. 1, Jan. 1987, pp. 52-57.
Bufler et al., "Scaling and Strain Dependence of Nanoscale Strained-Si p-MOSFET Performance," IEEE Transactions on Electron Devices, vol. 50, No. 12, Dec. 2003, pp. 2461-2466.
Shima et al., "<100> Channel Strained-SIGe p-MOSFET with Enhanced Hole Mobility and Lower Parasitic Resistance," IEEE 2002 Symposium on VLSI Technology Digest of Technical Papes, pp. 94-95.

* cited by examiner

*Primary Examiner*—Bradley K. Smith
*Assistant Examiner*—Steven J. Fulk
(74) *Attorney, Agent, or Firm*—James L. Clingan, Jr.; Michael Balconi-Lamica

(57) ABSTRACT

P channel transistors are formed in a semiconductor layer that has a (110) surface orientation for enhancing P channel transistor performance, and the N channel transistors are formed in a semiconductor layer that has a (100) surface orientation. To further provide P channel transistor performance enhancement, the direction of their channel lengths is selected based on their channel direction. The narrow width P channel transistors are preferably oriented in the <100> direction. The wide channel width P channel transistors are preferably oriented in the <110> direction.

24 Claims, 1 Drawing Sheet

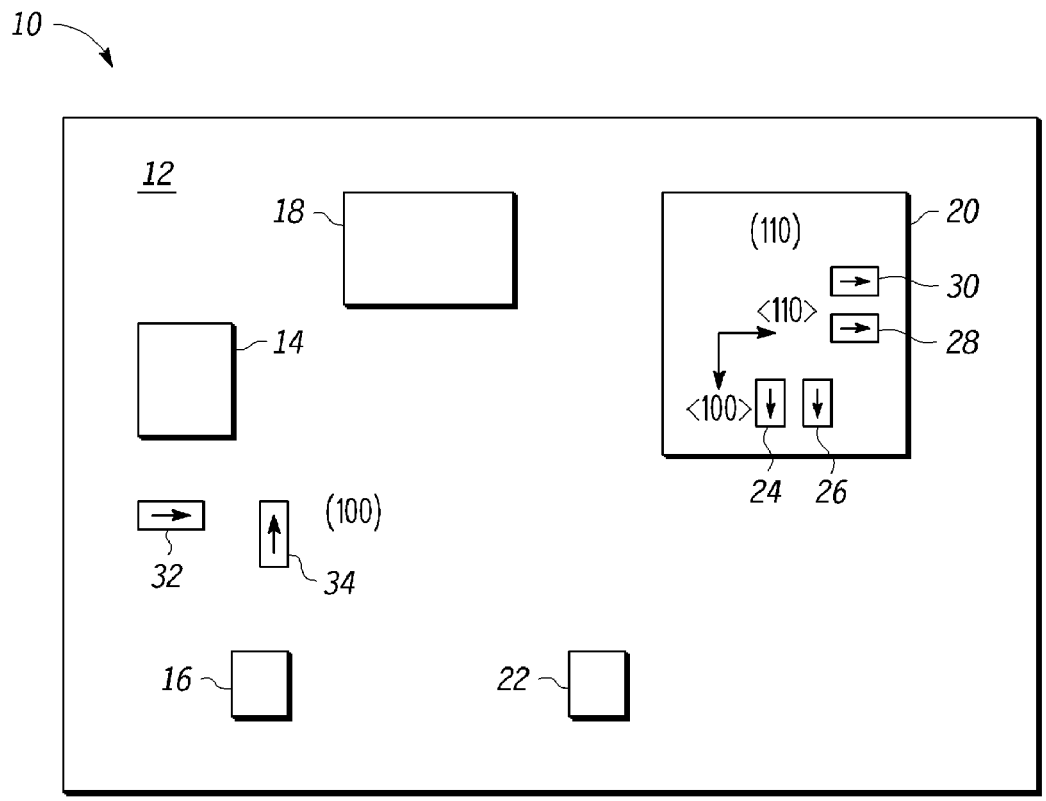
FIGURE

CHANNEL ORIENTATION TO ENHANCE TRANSISTOR PERFORMANCE

FIELD OF THE INVENTION

This invention relates to semiconductor devices, and more particularly, to a semiconductor device structure having transistors oriented to enhance performance.

RELATED ART

Techniques that are being developed to enhance transistor performance include straining the semiconductor material in which the transistors are made and selecting the surface crystal orientation of this semiconductor material. These enhancements tend to be different for P channel transistors and N channel transistors. Thus techniques have been developed to differentiate these strain and orientation characteristics in the same die. For example, techniques are being developed for providing compressive SiGe to enhance P channel transistor performance on the same die as tensile silicon to enhance N channel transistor performance. Similarly, there is a technique for providing a semiconductor having two different surface orientations, one for enhancing the N channel transistors and the other for enhancing the P channel transistors. As these enhancements are beneficial, they don't take into account that other distinctions than transistor conductivity type (P vs. N channel) can effect performance.

Thus, there is a need for additional enhancements to transistor performance that take into account characteristics other than just conductivity type.

BRIEF DESCRIPTION OF THE DRAWINGS

The present invention is illustrated by way of example and not limited by the accompanying FIGURE, in which like references indicate similar elements, and in which:

The sole FIGURE is a top view of a semiconductor device according to a preferred embodiment of the invention.

Skilled artisans appreciate that elements in the FIGURE are illustrated for simplicity and clarity and have not necessarily been drawn to scale. For example, the dimensions of some of the elements in the FIGURES may be exaggerated relative to other elements to help improve the understanding of the embodiments of the present invention.

DETAILED DESCRIPTION OF THE DRAWINGS

In one aspect, the P channel transistors are formed in a semiconductor layer that has a (110) surface orientation for enhancing P channel transistor performance. To further provide P channel transistor performance, the direction of their channel lengths is selected based on their channel direction. The narrow width P channel transistors are preferably oriented in the <100> direction. The wide channel width P channel transistors are preferably oriented in the <110> direction. This is better understood by reference to the FIGURE and the following description.

Shown in the sole FIGURE is a semiconductor device 10 having a background semiconductor region 12 having a (100) surface for forming N channel transistors and P channel regions 14, 16, 18, 20, and 22 having a (110) surface. Having a (110) surface for the P channel transistors provides about a 40%, but at least 20%, improvement in mobility over having the P channel transistors formed in a semiconductor layer having a (100) surface. Mobility translates to saturation current for a given bias condition. Region 22 has formed therein transistors 24, 26, 28, and 30. Region 20 has shown thereon a <110> direction and a <100> direction orthogonal thereto. Transistors 28 and 30 have their channels in the <110> direction, and transistors 24 and 26 have their channels in the <100> direction. Semiconductor region 12 is preferably silicon but could be a different material. Similarly, this semiconductor region 12 is preferably strained but could be relaxed. P channel regions 14, 16, 18, 20, and 22 are preferably silicon but may be a different material, for example silicon germanium. These P channel regions 14, 16, 18, 20, and 22 are preferably compressively strained but could also be relaxed or even tensile. It is preferable that all of the regions 12, 14, 16, 18, 20, and 22 be semiconductor on insulator regions but that may be difficult to achieve, especially for regions 14, 16, 18, 20 and 22. Thus, they may be either semiconductor on insulator or semiconductor on semiconductor, wherein the top semiconductor is silicon, germanium, or silicon germanium.

Transistors 24 and 26 have a channel width less than or equal to 2 microns, whereas transistors 28 and 30 have a channel width greater than 2 microns. These channel directions for P channel transistors 24 and 26 take advantage of the enhanced performance of narrow width transistors that have their channels in the <100> direction. The enhancement for a narrow width P channel transistor, for example, a 1 micron channel width, in changing the channel direction from the <110> direction to the <100> direction has been found to be about a 25% increase in drive current. Drive current enhancements are larger at narrower widths. Similarly, the loss in drive current, when changing from a (110) surface to a (100) surface is about 30%. The result is that there is only about a 5% difference in mobility between 5 micron width and 1 micron width devices if the wide channel transistors have their channels in the <110> direction and the narrow channel transistors have their channels in the <100> direction. Accordingly, the preference is that substantially all of the P channel transistors that have their channels aligned in the <100> direction have narrow channel widths. Narrow channel width means less than or equal to 2 microns. It typically improves layout efficiency to be able to have transistors aligned in more than just one direction. Thus, there is not only the benefit of improving performance but also a benefit in layout efficiency in having transistors in both the <100> and <110> directions.

Also shown in the FIGURE are N channel transistors 32 and 34 having orthogonal directions formed in region 12. Region 12 may also have P channel transistors formed therein. There may be situations in which it would be advantageous to do so. This would likely come up in situations in which the need for optimized performance was less than the layout benefits. Similarly, there may be situations where it is advantageous to have N channel transistors formed in one or more of regions 14, 16, 18, 20, and 22. Also semiconductor device 10 can provide any integrated circuit function, for example, can a microprocessor, an embedded controller, or an RF circuit. N channel transistors and P channel transistors are also called NMOS and PMOS devices, respectively In the foregoing specification, the invention has been described with reference to specific embodiments. However, one of ordinary skill in the art appreciates that various modifications and changes can be made without departing from the scope of the present invention as set forth in the claims below. Certain materials were described and these may be varied. Accordingly, the specification and FIGURES are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a semiconductor device, comprising:
   providing a semiconductor region having a (110) surface orientation;
   forming PMOS devices with a <100> channel direction within the semiconductor region, wherein substantially all of the PMOS devices are narrow width PMOS devices having a channel width of less than or equal to 2 µm; and
   forming a wide width PMOS device with a <110> channel direction within the semiconductor region, wherein the wide width PMOS device has a channel width on the order of greater than 2 µm and wherein the narrow width PMOS devices have an enhanced performance characteristic over a similar performance characteristic of the wide width PMOS device.

2. The method of claim 1, further wherein the enhanced performance characteristic comprises a saturation current having an enhanced performance greater than twenty percent (20%).

3. The method of claim 1, wherein the PMOS devices include strained narrow width PMOS devices.

4. The method of claim 1, wherein the wide width PMOS device includes a strained wide width PMOS device.

5. The method of claim 1, wherein the semiconductor region comprises one selected from the group consisting of a semiconductor on insulator region and a semiconductor on semiconductor region.

6. The method of claim 5, wherein the semiconductor on insulator region includes one or more of the group consisting of silicon on insulator, germanium on insulator, and silicon-germanium on insulator.

7. The method of claim 1, further wherein the semiconductor region having the (110) surface orientation forms a portion of a background semiconductor material, the background semiconductor material having a (100) surface orientation.

8. The method of claim 7, further comprising:
   forming at least one of NMOS and PMOS devices in the background semiconductor material, outside of the semiconductor region having the (110) surface orientation.

9. The method of claim 8, wherein the at least one of NMOS and PMOS devices comprise strained devices.

10. The method of claim 7, further wherein the background semiconductor material comprises one selected from the group consisting of a semiconductor on insulator substrate and a semiconductor on semiconductor substrate.

11. The method of claim 10, wherein the semiconductor on insulator substrate includes one or more of the group consisting of silicon on insulator, germanium on insulator, and silicon-germanium on insulator, and wherein the semiconductor on semiconductor substrate includes one or more of silicon, germanium, and silicon germanium.

12. A method of making a semiconductor device, comprising:
    providing a semiconductor region having a (110) surface orientation, wherein the semiconductor region comprises one selected from the group consisting of a semiconductor on insulator region and a semiconductor on semiconductor region, further wherein the semiconductor region having the (110) surface orientation forms a portion of a background semiconductor material, the background semiconductor material having a (100) surface orientation;
    forming PMOS devices with a <100> channel direction within the semiconductor region, wherein substantially all of the PMOS devices are narrow width PMOS devices that comprise strained devices having a channel width of less than or equal to 2 µm;
    forming a wide width PMOS device with a <110> channel direction within the semiconductor region, wherein the wide width PMOS device comprises a strained device having a channel width on the order of greater than 2 µm and wherein the narrow width PMOS devices have an enhanced performance characteristic over a similar performance characteristic of the wide width PMOS device; and
    forming at least one of NMOS and PMOS devices in the background semiconductor material, outside of the semiconductor region having the (110) surface orientation, wherein the at least one of NMOS and PMOS devices comprise strained devices, further wherein the background semiconductor material comprises one selected from the group consisting of a semiconductor on insulator substrate and a semiconductor on semiconductor substrate.

13. A semiconductor device, comprising:
    a semiconductor region having a (110) surface orientation;
    PMOS devices with a <100> channel direction within the semiconductor region, wherein substantially all of the PMOS devices are narrow width PMOS devices having a channel width of less than or equal to 2 µm; and
    a wide width PMOS device with a <110> channel direction within the semiconductor region, wherein the wide width PMOS device has a channel width on the order of greater than 2 µm and wherein the narrow width PMOS devices have an enhanced performance characteristic over a similar performance characteristic of the wide width PMOS device.

14. The semiconductor device of claim 13, further wherein the enhanced performance characteristic comprises a saturation current having an enhanced performance on the order of greater than twenty percent (20%).

15. The semiconductor device of claim 13, wherein the narrow width PMOS devices include strained narrow width PMOS devices.

16. The semiconductor device of claim 13, wherein the wide width PMOS device includes a strained wide width PMOS device.

17. The semiconductor device of claim 13, wherein the semiconductor region comprises one or more of the group consisting of a semiconductor on insulator region and a semiconductor on semiconductor region, and wherein the semiconductor on semiconductor substrate includes one or more of silicon, germanium, and silicon germanium.

18. The semiconductor device of claim 17, wherein the semiconductor on insulator region includes one or more of the group consisting of silicon on insulator, germanium on insulator, and silicon-germanium on insulator.

19. The semiconductor device of claim 13, further wherein the semiconductor region having the (110) surface orientation forms a portion of a background semiconductor material, the background semiconductor material having a (100) surface orientation.

20. The semiconductor device of claim 19, further comprising:
at least one of NMOS and PMOS devices formed in the background semiconductor material, outside of the semiconductor region having the (110) surface orientation.

21. The semiconductor device of claim 20, wherein the at least one of NMOS and PMOS devices comprise strained devices.

22. The semiconductor device of claim 19, further wherein the background semiconductor material comprises one selected from the group consisting of a semiconductor on insulator substrate and a semiconductor on semiconductor substrate.

23. The semiconductor device of claim 22, wherein the semiconductor on insulator substrate includes one or more of the group consisting of silicon on insulator, germanium on insulator, and silicon-germanium on insulator, and wherein the semiconductor on semiconductor substrate includes one or more of silicon, germanium, and silicon germanium.

24. The semiconductor device of claim 13, wherein the semiconductor device comprises one selected from the group consisting of a microprocessor, a memory, an embedded controller, and an RF circuit.

* * * * *